US012615805B2

(12) United States Patent
Li et al.

(10) Patent No.: US 12,615,805 B2
(45) Date of Patent: Apr. 28, 2026

(54) DISPLAY PANEL WITH IMPROVED MOBILITY OF THE THIN FILM TRANSISTOR

(71) Applicant: WUHAN CHINA STAR OPTOELECTRONICS TECHNOLOGY CO., LTD., Wuhan (CN)

(72) Inventors: Zhifu Li, Wuhan (CN); Guanghui Liu, Wuhan (CN); Chao Dai, Wuhan (CN); Fei Ai, Wuhan (CN); Dewei Song, Wuhan (CN); Zhuang Li, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 494 days.

(21) Appl. No.: 18/247,554

(22) PCT Filed: Feb. 28, 2023

(86) PCT No.: PCT/CN2023/078710
§ 371 (c)(1),
(2) Date: Mar. 31, 2023

(87) PCT Pub. No.: WO2024/060514
PCT Pub. Date: Mar. 28, 2024

(65) Prior Publication Data
US 2024/0363758 A1 Oct. 31, 2024

(30) Foreign Application Priority Data
Sep. 19, 2022 (CN) .......................... 202211139533.9

(51) Int. Cl.
*H10D 30/67* (2025.01)
*H10D 30/69* (2025.01)
(Continued)

(52) U.S. Cl.
CPC ..... *H10D 30/6758* (2025.01); *H10D 30/6723* (2025.01); *H10D 30/6729* (2025.01);
(Continued)

(58) Field of Classification Search
CPC ........... H10D 30/6732; H10D 30/6734; H10D 62/292; H10D 30/751; H10K 10/466; H01L 21/28114
See application file for complete search history.

(56) References Cited

U.S. PATENT DOCUMENTS 6,010,922 A * 1/2000 Hata .................... H10D 30/673 438/158
7,629,633 B2 * 12/2009 Chan ................. H10D 30/6728 257/263
(Continued)

FOREIGN PATENT DOCUMENTS

CN 105185839 A 12/2015
CN 105489615 A 4/2016
(Continued)

OTHER PUBLICATIONS

International Search Report in International application No. PCT/CN2023/078710,mailed on Apr. 27, 2023.
(Continued)

*Primary Examiner* — Maliheh Malek
(74) *Attorney, Agent, or Firm* — PV IP PC; Christopher S. Ruprecht; Wei Te Chung

(57) ABSTRACT

A display panel is provided by embodiments of the present application, a thin film transistor includes: a first gate electrode including a first side slope, a second side slope oppositely arranged, and a top surface; a first gate insulating layer covering the first gate electrode; a semiconductor layer arranged on the first gate insulating layer, wherein the semiconductor layer includes a first end, a second end, and (Continued)

a channel arranged between the first end and the second end, the second end is at least partially on the top surface, the channel is at least partially located on the first side slope.

16 Claims, 9 Drawing Sheets

(51) Int. Cl.
$\quad$ *H10D 62/17* $\quad\quad\quad$ (2025.01)
$\quad$ *H01L 21/28* $\quad\quad\quad$ (2025.01)

(52) U.S. Cl.
$\quad$ CPC ....... *H10D 30/6757* (2025.01); *H10D 62/292* (2025.01); *H01L 21/28114* (2013.01); *H10D 30/673* (2025.01); *H10D 30/751* (2025.01)

(56) References Cited

U.S. PATENT DOCUMENTS

| | | | | |
|---|---|---|---|---|
| 9,806,100 | B2 * | 10/2017 | Bae .................... | H10D 30/0321 |
| 10,693,015 | B2 * | 6/2020 | Jang .................. | H10D 30/6723 |
| 10,860,154 | B2 * | 12/2020 | Li .......................... | G06F 3/0448 |
| 2006/0145281 | A1 * | 7/2006 | Jiroku ............... | H10D 30/6723 |
| | | | | 257/66 |
| 2008/0143664 | A1 * | 6/2008 | Nakagawa ........... | G02F 1/1368 |
| | | | | 345/92 |
| 2009/0194821 | A1 * | 8/2009 | Kaneko ............. | H10D 30/0227 |
| | | | | 257/377 |
| 2012/0181512 | A1 * | 7/2012 | Puntambekar ....... | H10K 10/468 |
| | | | | 257/40 |
| 2015/0214258 | A1 * | 7/2015 | Youn .................... | H10D 86/021 |
| | | | | 438/158 |
| 2015/0263171 | A1 * | 9/2015 | Hsu .................... | H10D 30/0278 |
| | | | | 257/77 |
| 2015/0295064 | A1 * | 10/2015 | van Dal ............. | H10D 84/0128 |
| | | | | 257/288 |
| 2017/0104015 | A1 * | 4/2017 | Bae .................... | H10D 30/6713 |
| 2017/0133516 | A1 * | 5/2017 | Ren .................... | H10D 30/674 |
| 2017/0338315 | A1 * | 11/2017 | Yamazaki ........... | H10D 62/292 |
| 2019/0081080 | A1 * | 3/2019 | Xie .................... | H10F 39/1515 |
| 2019/0245016 | A1 * | 8/2019 | Lee .................... | H10D 30/6745 |
| 2019/0312148 | A1 * | 10/2019 | Pi ...................... | H10D 30/6723 |
| 2020/0192525 | A1 * | 6/2020 | Li ......................... | G06F 3/0446 |
| 2021/0091123 | A1 * | 3/2021 | Ren .................... | H10D 86/441 |
| 2021/0305284 | A1 | 9/2021 | He et al. | |
| 2021/0327975 | A1 * | 10/2021 | Ma .................... | H10K 59/8791 |
| 2024/0032396 | A1 * | 1/2024 | Ni ...................... | H10K 59/873 |
| 2024/0047582 | A1 * | 2/2024 | Choi ................. | H10D 30/6757 |
| 2025/0089368 | A1 * | 3/2025 | Zhao ................. | H10D 30/6713 |
| 2025/0212512 | A1 * | 6/2025 | Li ......................... | H10D 86/60 |
| 2025/0220964 | A1 * | 7/2025 | Lee .................... | H10D 30/6757 |

FOREIGN PATENT DOCUMENTS

| | | | |
|---|---|---|---|
| CN | 106024637 A | 10/2016 | |
| CN | 109244081 A | 1/2019 | |
| CN | 112968061 A | 6/2021 | |
| CN | 113745345 A | 12/2021 | |
| CN | 113871401 A | 12/2021 | |
| CN | 115458587 A | 12/2022 | |
| JP | 2013115111 A | 6/2013 | |
| WO | WO-2020042337 A1 * | 3/2020 | ......... H10K 59/8793 |

OTHER PUBLICATIONS

Written Opinion of the International Search Authority in International application No. PCT/CN2023/078710,mailed on Apr. 27, 2023.
Chinese Office Action issued in corresponding Chinese Patent Application No. 202211139533.9 dated Jun. 3, 2025, pp. 1-10.

* cited by examiner

DISPLAY PANEL WITH IMPROVED MOBILITY OF THE THIN FILM TRANSISTOR

BACKGROUND OF INVENTION

Field of Invention

The present application relates to a field of display technology, in particular to a display panel.

Description of Prior Art

Integrating integrated circuit on a substrate (a glass substrate or a flexible substrate) (system on glass, SOG) can greatly improve integration of a display panel and reduce a manufacturing cost of the display panel. However, realizing the integration of the integrated circuit on the substrate needs to improve mobility of a traditional thin film transistor, and requires a smaller thin film transistor.

However, a current thin film transistor has problems of insufficient mobility and too large size.

SUMMARY OF INVENTION

Embodiments of the present application provide a display panel to solve problems of insufficient mobility and too large size of a current thin-film-transistor.

The embodiments of the present application provide a display panel, including a substrate and a thin film transistor arranged on the substrate, wherein the thin film transistor includes:

a first gate arranged on the substrate, wherein the first gate includes a first side slope and a second side slope oppositely arranged, and a top surface is arranged between the first side slope and the second side slope;

a first gate insulating layer covering the substrate, the first side slope, the second side slope, and the top surface; and a semiconductor layer arranged on the first gate insulating layer, wherein the semiconductor layer includes a first end, a second end, and a channel located between the first end and the second end, the second end is at least partially located on the top surface, and the channel is at least partially located on the first side slope.

Optionally, in some embodiments of the present application, wherein an orthographic projection of the channel on the substrate overlaps an orthographic projection of the first side slope on the substrate.

Optionally, in some embodiments of the present application, wherein a slope angle between the first side slope and the substrate is greater than or equal to 45 degree and less than or equal to 90 degree.

Optionally, in some embodiments of the present application, wherein a thickness of the first gate insulating layer corresponding to the substrate is greater than a thickness of the first gate insulating layer corresponding to the first side slop.

Optionally, in some embodiments of the present application, wherein the thickness of the first gate insulating layer corresponding to the substrate is 1.2 to 2 times the thickness of the first gate insulating layer corresponding to the first side slop.

Optionally, in some embodiments of the present application, wherein a thickness of the first gate electrode is 0.1 microns to 1 micron.

Optionally, in some embodiments of the present application, wherein a length of the first side slope is less than or equal to 0.3 microns.

Optionally, in some embodiments of the present application, wherein the channel is at least part of a single crystalline grain.

Optionally, in some embodiments of the present application, wherein a length of the channel ranges from 0.1 microns to 1 micron.

Optionally, in some embodiments of the present application, wherein the first gate insulating layer corresponding to an end of the first side slope close to the substrate forms a corner part, and the channel covers the corner part.

Optionally, in some embodiments of the present application, wherein the thin film transistor further includes:

a first insulating layer arranged on the semiconductor layer;

a first through hole penetrating the first insulating layer;

a second through hole penetrating the first insulating layer; and a source electrode and a drain electrode arranged on the first insulating layer, wherein one of the source electrode and the drain electrode is electrically connected to the first end through the first through hole, and another one of the source electrode and the drain electrode is electrically connected to the second end through the second through hole.

Optionally, in some embodiments of the present application, wherein the thin film transistor further includes:

a first insulating layer arranged on the semiconductor layer;

a first through hole penetrating the first insulating layer;

a second through hole penetrating the first insulating layer; and a source electrode and a drain electrode arranged on the first insulating layer, wherein one of the source electrode and the drain electrode is electrically connected to the first end through the first through hole, and another one of the source electrode and the drain electrode is electrically connected to the second end through the second through hole.

Optionally, in some embodiments of the present application, wherein the thin film transistor further includes:

a first insulating layer arranged on the semiconductor layer;

a first through hole penetrating the first insulating layer;

a second through hole penetrating the first insulating layer; and a source electrode and a drain electrode arranged on the first insulating layer, wherein one of the source electrode and the drain electrode is electrically connected to the first end through the first through hole, and another one of the source electrode and the drain electrode is electrically connected to the second end through the second through hole.

Optionally, in some embodiments of the present application, wherein the thin film transistor further includes:

a first insulating layer arranged on the semiconductor layer;

a first through hole penetrating the first insulating layer;

a second through hole penetrating the first insulating layer; and a source electrode and a drain electrode arranged on the first insulating layer, wherein one of the source electrode and the drain electrode is electrically connected to the first end through the first through hole, and another one of the source electrode and the drain electrode is electrically connected to the second end through the second through hole.

Optionally, in some embodiments of the present application, wherein the thin film transistor further includes:

a light shielding layer arranged between the substrate and the first gate electrode, wherein an orthographic projection of the light shielding layer on the substrate covers an orthographic projection of the channel on the substrate; and a passivation layer arranged between the light shielding layer and the first gate electrode.

Optionally, in some embodiments of the present application, wherein the thin film transistor further includes an extension part extending from the first side slope to a side close to the semiconductor layer, a thickness of the extension part is less than a thickness of the first gate electrode, and an orthographic projection of the extension part on the substrate at least partially overlaps an orthographic projection of the channel on the substrate.

Optionally, in some embodiments of the present application, wherein the thin film transistor further includes an extension part extending from the first side slope to a side close to the semiconductor layer, a thickness of the extension part is less than a thickness of the first gate electrode, and an orthographic projection of the extension part on the substrate at least partially overlaps an orthographic projection of the channel on the substrate.

Optionally, in some embodiments of the present application, wherein the thin film transistor further includes:

a second gate insulating layer arranged between the semiconductor layer and the first insulating layer; and a second gate electrode arranged between the second gate insulating layer and the first insulating layer, wherein the second gate electrode is arranged corresponding to the channel.

Optionally, in some embodiments of the present application, wherein the second gate insulating layer corresponding to the first side slope defines to a third side slope, and the second gate electrode is located on the third side slope.

Optionally, in some embodiments of the present application, wherein the thin film transistor further includes a third through hole penetrating through the first gate insulating layer and the second gate insulating layer, and the second gate electrode is connected to the first gate electrode through the third through hole.

Advantageous Effects

The present application provides the display panel, the display panel includes the substrate and the thin film transistor arranged on the substrate, the thin film transistor includes: the first gate electrode arranged on the substrate, the first gate electrode includes the first side slope and the second side slope oppositely arranged, and the top surface arranged between the first side slope and the second side slope; the first gate insulating layer covering the substrate, the first side slope, the second side slope and the top surface; the semiconductor layer arranged on the first gate insulating layer, the semiconductor layer includes the first end, the second end, and the channel arranged between the first end and the second end, wherein the second end is at least partially located on the top surface, and the channel is at least partially located on the first side slope. In the present application, by setting the semiconductor layer at least partially arranged on the first side slope of the first gate electrode, the thickness of the first gate electrode is smaller, and a length of the first side slope is smaller, so that a length of the channel of the semiconductor layer is smaller. In addition, in a process of crystallization to form the semiconductor layer, it is easier to form a seed crystal at the corner part of the end of the first side slope close to the substrate, when the seed crystal grows along the first side slope to form the single crystalline grain, the length of the channel on the first side slope is smaller, which provides formation conditions for the channel on the first side slope to be composed of the single crystalline grain, there is no grain boundary in the single crystalline grain, and the length of the channel the thin film transistor is smaller and includes the single crystalline grain, which improves mobility of the thin film transistor. Meanwhile, the semiconductor layer is at least partially arranged on the first side slope of the first gate electrode, and the length of the channel of the semiconductor layer is smaller, so that layout space of the thin film transistor is reduced, and a size of the thin film transistor is reduced.

BRIEF DESCRIPTION OF DRAWINGS

In order to illustrate the technical solutions in the embodiments of the present application more clearly, the following briefly introduces the drawings that are used in the description of the embodiments. Obviously, the drawings in the following description are only some embodiments of the present application. For those skilled in the art, other drawings can also be obtained from these drawings without creative effort.

DETAILED DESCRIPTION OF PREFERRED EMBODIMENTS

Figure 1:
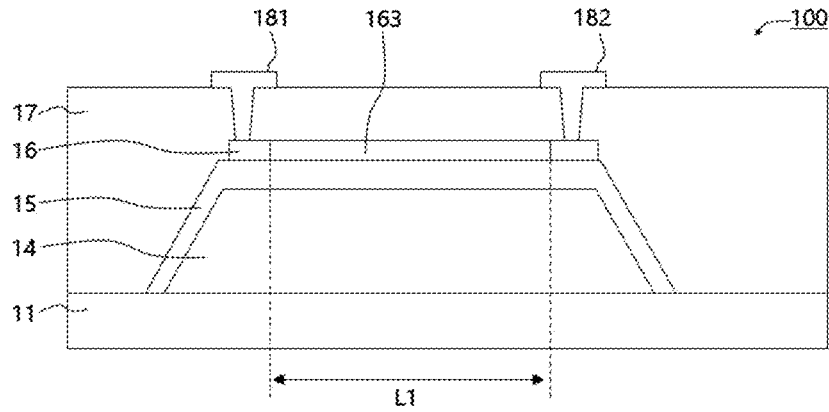
FIG. 1 is a schematic diagram of a conventional thin film transistor in the prior art.

The technical solutions in the embodiments of the present application will be clearly and completely described below with reference to the drawings in the embodiments of the present application. Obviously, the described embodiments are only a part of the embodiments of the present application, but not all of the embodiments. Based on the embodiments in the present application, all other embodiments obtained by those skilled in the art without creative work fall within the protection scope of the present application. In addition, it should be understood that the specific embodiments described herein are only used to illustrate and explain the present application, but not to limit the present application. In this application, unless otherwise stated, the directional words used such as "upper" and "lower" generally refer to the upper and lower sides of the device in actual use or working state, specifically the drawing direction in the accompanying drawings; while "inside" and "outside" refer to the outline of the device.

Please refer to FIG. 1, FIG. 1 is a schematic diagram of a conventional thin film transistor in the prior art. The conventional thin film transistor includes a first gate electrode 14 arranged on a substrate 11, a first gate insulating layer 15 arranged on the first gate electrode 14, a semiconductor layer 16 arranged on the first gate insulating layer 15, a first insulating layer 17 arranged on the semiconductor layer 16, and a source electrode 181 and a drain electrode 182 arranged on the first insulating layer 17 and the source electrode 181 and the drain electrode 182 electrically connected to the semiconductor layer 16. When the semiconductor layer 16 is located on a plane, due to limitations of exposure accuracy and etching accuracy in a display panel manufacturing process, a length L1 of a channel 163 of the semiconductor layer 16 is often greater than 2 microns, and the channel 163 with the length greater than 2 microns has more grain boundaries, resulting in lower mobility of the thin film transistor. When the semiconductor layer 16 is located on the plane and the length of the channel is larger, layout space of the thin film transistor is larger, and a size of the thin film transistor is larger.

Embodiments of the present application provide the display panel, the display panel includes a substrate and a thin film transistor arranged on the substrate, the thin film transistor includes: a first gate electrode arranged on the substrate, the first gate electrode includes a first side slope and a second side slope oppositely arranged, and a top surface arranged between the first side slope and the second side slope; a first gate insulating layer covering the substrate, the first side slope, the second side slope and the top surface; and a semiconductor layer arranged on the first gate insulating layer, the semiconductor layer includes a first end, a second end, and a channel arranged between the first end and the second end, wherein the second end is at least partially located on the top surface, and the channel is at least partially located on the first side slope.

The embodiments of the present application also provide a display terminal including the aforementioned display panel. Each of them will be described in detail below. It should be noted that the description order of the following embodiments is not intended to limit the preferred order of the embodiments.

Embodiment 1

Figure 2:
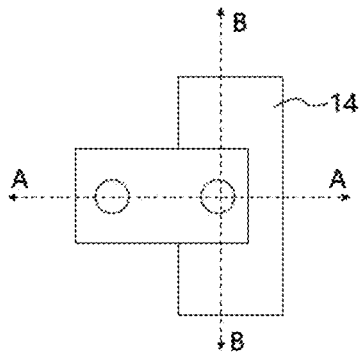
FIG. 2 is a schematic top view of a first thin film transistor of the display panel provided by an embodiment of the present application.
Figure 3:
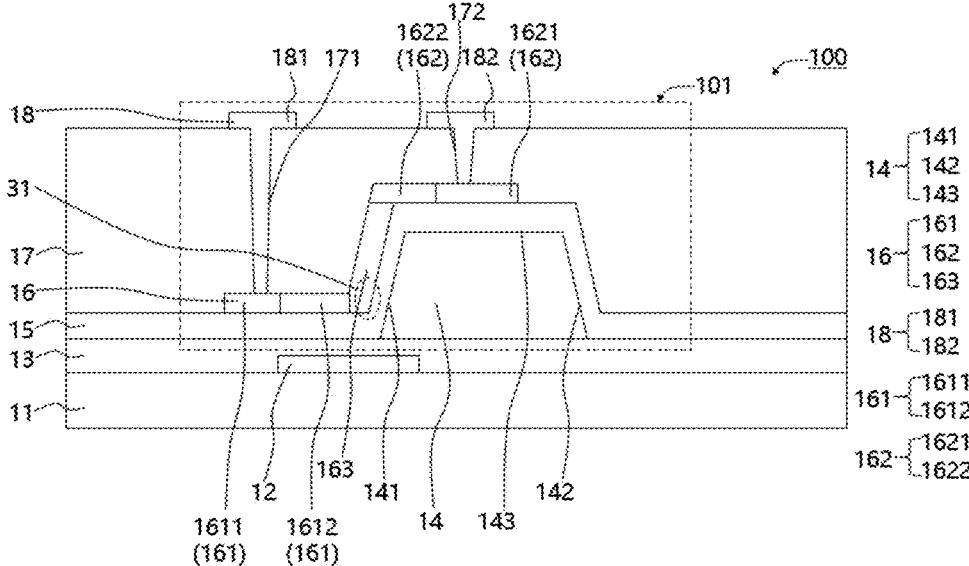
FIG. 3 is a first cross-section schematic diagram of the first thin film transistor of the display panel provided by an embodiment of the present application.

Please refer to FIG. 2 and FIG. 3; FIG. 2 is a schematic top view of a first thin film transistor of the display panel provided by an embodiment of the present application. FIG. 3 is a first cross-section schematic diagram of the first thin film transistor of the display panel provided by an embodiment of the present application. In order to clearly describe important structures of the thin film transistor in FIG. 2, only part of film layers or structures of the thin film transistor is illustrated in FIG. 2, FIG. 3 is a schematic cross-sectional view of a dotted line A-A in FIG. 2.

The embodiment of the present application provides the display panel 100, the display panel 100 includes the substrate 11 and the thin film transistor 101 arranged on the substrate 11, the thin film transistor 101 includes the first gate electrode 14, the first gate insulating layer 15 and the semiconductor layer 16. The first gate electrode 14 is arranged on the substrate 11, and the first gate electrode 14 includes the first side slope 141 and the second side slope 142 oppositely arranged, and the top surface 143 is arranged between the first side slope 141 and the second side slope 142. The first gate insulating layer 15 covers the substrate 11, the first side slope 141, the second side slope 142 and the top surface 143. The semiconductor layer 16 is arranged on the first gate insulating layer 15. The semiconductor layer 16 includes the first end 161, the second end 162, and the channel 163 located between the first end 161 and the second end 162, wherein the second end 162 is at least partially located on the top surface 143, and the channel 163 is at least partially located on the first end 162 on the side slope 141.

Specifically, the substrate 11 may be a glass or a flexible substrate, which is not limited herein.

Specifically, the first gate electrode 14 is arranged on the substrate 11, and the first gate electrode 14 includes the first side slope 141 and the second side slope 142 oppositely arranged, and the top surface 143 is arranged between the first side slope 141 and the second side slope 142. A cross-sectional shape of the first gate electrode 14 may be a trapezoid, but is not limited thereto. The top surface 143 is a surface of the first gate electrode 14 away from the substrate 11, and the top surface 143 is connected between the first side slope 141 and the second side slope 142. In a schematic cross-sectional view, a surface of the first side slope 141 and a surface of the second side slope 142 may be straight lines, arc shapes or multi-segment lines, which are not limited herein.

Specifically, the first gate insulating layer 15 covers the substrate 11, the first side slope 141, the second side slope 142 and the top surface 143. That is, the first gate insulating layer 15 is arranged on the first gate electrode 14, and a part of the substrate 11 without the first gate electrode 14 is also covered by the first gate insulating layer 15.

Specifically, the semiconductor layer 16 is arranged on the first gate insulating layer 15, the semiconductor layer 16 includes the first end 161, the second end 162, and the channel 163 located between the first end 161 and the second end 162, wherein the second ends 162 is at least partially located on the top surface 143, and the channel 163 is at least partially located on the first side slope 141. The semiconductor layer 16 is arranged on the gate insulating layer 15, and the channel 163 is at least partially located on the first side slope 141, and an orthographic projection of the channel 163 on the substrate 11 at least partially overlaps an orthographic projection of the first side slope 141 on the substrate 11, the first end 161 and the second end 162 connect both sides of the channel 163.

Specifically, an orthographic projection of the first end 161 on the substrate 11 at least partially not overlaps an orthographic projection of the first gate electrode 14 on the substrate 11, and an orthographic projection of the second end 162 on the substrate 11 at least partially overlaps an orthographic projection of the top surface 143 of the first gate electrode 14 on the substrate 11.

Specifically, the first gate insulating layer 15 covers the first gate electrode 14, the second end 162 is at least partially located on the top surface 143, and the channel 163 is at least partially located on the first side slope 141. It means that the second end 162 is located on the first gate insulating layer 15, and at least partially corresponds to or overlaps with the top surface 143; and it means that the channel 163 is located on the first gate insulating layer 15, and at least partially corresponds to or overlaps with the first side slope 141.

Specifically, the channel 163 is at least partially located on the first side slope 141 means that the channel 163 of the semiconductor layer 16 is all located on the first side slope 141. Or a part of the channel 163 of the semiconductor layer 16 is located on the first side slope 141, another part of the channel 163 of the semiconductor layer 16 is located on the first gate insulating layer 15 on the substrate. Or a part of the channel 163 of the semiconductor layer 16 is located on the first side slope 141, another part of the channel 163 of the semiconductor layer 16 is located on the top surface 143 of the first gate electrode 14. Or a part of the channel 163 of the semiconductor layer 16 is located on the first side slope 141, and another part of the channel 163 of the semiconductor layer 16 is located on the first gate insulating layer 15 on the substrate and located on the top surface 143 of the first gate electrode 14.

It should be noted that, when the channel 163 is designed to be located on the first side slope 141, due to a problem of process variation, the channel 163 may not be completely on the first side slope 141.

Specifically, the first gate electrode 14 may be at least one of a protruding quadrangular pyramid structure, a protruding cube structure, or a protruding cuboid structure, but a structure of the first gate electrode 14 may not be limited thereto.

Specifically, materials of the first gate electrode 14 may be any materials in the prior art, for example, the materials of the first gate electrode 14 may be one or more of copper, aluminum, titanium, etc., which will not be repeated here.

Specifically, the first end 161 includes a first heavily doped part 1611 and a first lightly doped part 1612, and the first lightly doped part 1612 is connected between the first heavily doped part 1611 and the channel 163. The second end 162 includes a second heavily doped part 1621 and a second lightly doped part 1622, and the second lightly doped part 1622 is connected between the second heavily doped part 1621 and the channel 163. Doping ions in the first heavily doped part 1611, the first lightly doped part 1612, the second heavily doped part 1621 and the second lightly doped part 1622 are the same as those in the prior art, and are not repeated here.

In this embodiment, the semiconductor layer 16 is at least partially arranged on the first side slope 141 of the first gate electrode 14, a thickness of the first gate electrode 14 is smaller, and a length of the first side slope 141 is smaller, so that the length of the channel 16 of the semiconductor layer 16 is smaller. In addition, in a process of crystallization to form the semiconductor layer 16, it is easier to form a seed crystal at a corner part 31 of the first side slope 141 close to an end of the substrate 11, when the seed crystal grows along the first side slope 141 to form a single crystalline grain, the length of the channel 163 on the first side slope 141 is smaller, which provides formation conditions for the channel 163 on the first side slope 141 to be composed of the single crystalline grain. There is no grain boundary in the single crystalline grain, which improves mobility of the thin film transistor 101. At the same time, the semiconductor layer 16 is at least partially arranged on the first side slope 141 of the first gate electrode 14, and the length of the channel 163 of the semiconductor layer 16 is smaller, so that the layout space of the thin film transistor 101 is reduced, and the size of the thin film transistor 101 is reduced.

Embodiment 2

This embodiment is the same as or similar to the embodiment 1, difference is that features of the display panel 100 are further described.

Figure 4:
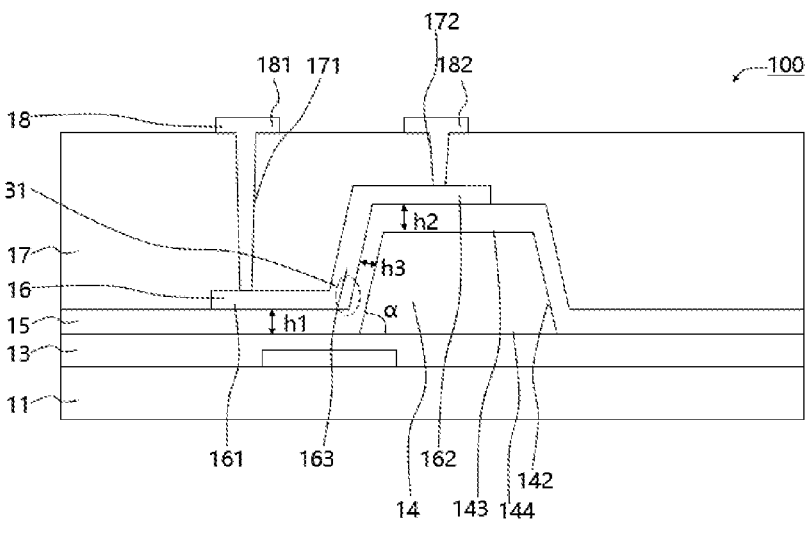
FIG. 4 is a second cross-section schematic diagram of the first thin film transistor of the display panel provided by an embodiment of the present application.
Figure 5:
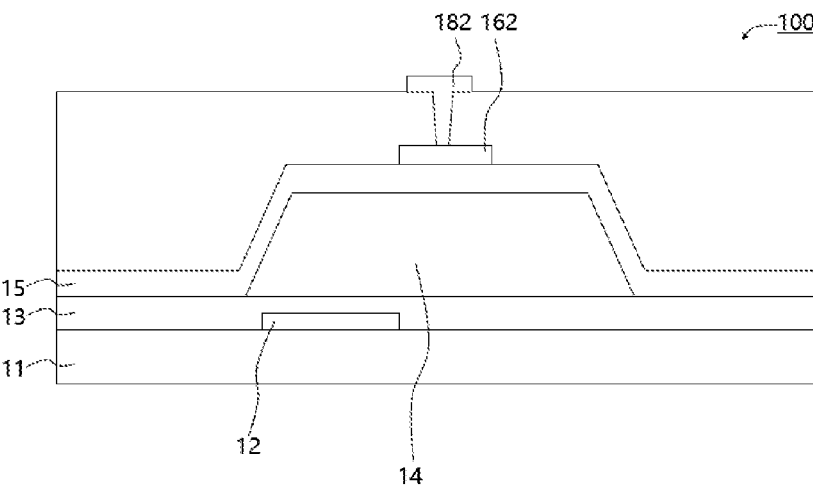
FIG. 5 is a third cross-section schematic diagram of the first thin film transistor of the display panel provided by an embodiment of the present application.

Please refer to FIG. 2, FIG. 3, FIG. 4 and FIG. 5; FIG. 4 is a second cross-section schematic diagram of the first thin film transistor of the display panel provided by an embodiment of the present application. FIG. 5 is a third cross-section schematic diagram of the first thin film transistor of the display panel provided by an embodiment of the present application. FIG. 5 is a schematic cross-sectional view of a dotted line B-B in FIG. 2. FIG. 4 is the same as FIG. 3, and some dimension information of the thin film transistor 101 is marked in FIG. 4.

In some embodiments, the orthographic projection of the channel 163 on the substrate 11 overlaps the orthographic projection of the first side slope 141 on the substrate 11.

Specifically, the orthographic projection of the channel 163 on the substrate 11 overlaps the orthographic projection of the first side slope 141 on the substrate 11, that is, the channel 163 is only located on the first side slope 141, and the channel 163 can occupy a smaller layout space at this time, which is helpful for reducing the size of the thin film transistor.

In some embodiments, a slope angle α between the first side slope 141 and the substrate 11 is greater than or equal to 45 degree and less than or equal to 90 degree.

Specifically, the slope angle α between the first side slope 141 and the substrate 11 is greater than or equal to 45 degree and less than or equal to 90 degree. The slope angle α refers to an angle between the first side slope 141 and a plane of the substrate 11 at the corner part 31, or the slope angle α refers to an angle between the first side slope 141 and a bottom surface 144 at the corner part 31. The first gate electrode 14 includes the bottom surface 144, and the bottom surface 144 refers to a surface of the first gate electrode 14 close to the substrate 11, or a surface opposite to the top surface 143.

Specifically, the slope angle α between the first side slope 141 and the substrate 11 may be 45 degree, 50 degree, 55 degree, 60 degree, 65 degree, 70 degree, 75 degree, 80 degree, 85 degree or 90 degree.

Specifically, the slope angle α between the first side slope 141 and the substrate 11 is greater than or equal to 45 degree and less than or equal to 90 degree, which is conducive to easier formation of the seed crystal at the corner part 31, and the seed crystal grows along the first side slope 141 so that the channel 163 is more likely to be composed of the single crystalline grain.

In some embodiments, a thickness h1 of the first gate insulating layer 15 corresponding to the substrate 11 is greater than a thickness h3 of the first gate insulating layer 15 corresponding to the first side slope 141.

Specifically, the thickness h3 of the first gate insulating layer 15 at the first side slope 141 refers to the thickness of the first gate insulating layer 15 in a direction perpendicular to the first side slope 141.

Specifically, the thickness h1 of the first gate insulating layer 15 corresponding to the substrate 11 is greater than the thickness h3 of the first gate insulating layer 15 corresponding to the first side slope 141, which can be control of film forming process parameters of the first gate insulating layer 15 to change a step coverage of the first gate insulating layer 15, so that the thickness h1 of the first gate insulating layer 15 on the first side slope 141 is thinner, and the thickness h1 of the first gate insulating layer 15 at the substrate 11 or/and a thickness h2 of the first gate insulating layer 15 on the top surface 143 is thicker. For example, the thickness h1 of the first gate insulating layer 15 at the substrate 11 is 1800 angstroms, and the thickness h3 of the first gate insulating layer 15 at the first side slope 141 is 900 angstroms, therefore, an ability of the first gate electrode 14 to control the channel 163 is enhanced, and the thickness h1 of the first gate insulating layer 15 on the substrate 11 or/and the thickness h3 of the first gate insulating layer 15 on the top surface 143 is thicker, so that a coupling (capacitive coupling) between a source electrode 181 or/and a drain electrode 182 and the first gate electrode 14 is reduced, avoiding mutual interference between potentials of the source electrode 181 or/and the drain electrode 182 and the first gate electrode 14, and improving a performance of thin film transistor 101.

In some embodiments, the thickness h1 of the first gate insulating layer 15 corresponding to the substrate 11 is 1.2 times to 2 times the thickness h3 of the first gate insulating layer 15 corresponding to the first side slope 141.

Specifically, the thickness h1 of the first gate insulating layer 15 at the substrate 11 is 1.2 times to 2 times the thickness h3 of the first gate insulating layer 15 at the first side slope 141, and the first gate insulating layer 15 at the substrate 11 may be 1.2 times, 1.3 times, 1.4 times, 1.5 times, 1.6 times, 1.7 times, 1.8 times, 1.9 times, 2.0 times, 2.1 times, and 2.2 times, thereby enhancing the ability of the first gate electrode 14 control the channel 163, so that the coupling (capacitive coupling) between the source electrode 181 or/and the drain electrode 182 and the first gate electrode 14 is reduced, avoiding the potentials of the source electrode 181 or/and the drain electrode 182 and the first gate electrode 14 interfere with each other, which improves the performance of the thin film transistor 101.

In some embodiments, a thickness of the first gate electrode 14 is 0.1 microns to 1 micron.

Specifically, the thickness of the first gate electrode 14 is 0.1 microns to 1 micron, the thickness of the first gate electrode 14 may be 0.1 microns, 0.3 microns, 0.5 microns, 0.7 microns, 0.9 microns, and 1 micron, and the thickness of the first gate electrode 14 is smaller, so that the length of the first side slope 141 is smaller, the length of the channel 163 on the first side slope 141 is smaller, and the length of the channel 163 on the first side slope 141 is less than the channel in a conventional technology length (the length of the channel in the conventional technology is more than 2 microns). In addition, in the process of crystallization to form the semiconductor layer 16, the semiconductor layer 16 before crystallization is more likely to form the seed crystal at the corner part 31, and when the seed crystal grows along the first side slope 141 to form the single crystalline grain, the length of the side slope 141 is smaller, which provides the formation conditions for the channel 163 on the first side slope 141 to be composed of the single crystalline grain, and there is no grain boundary in the single crystalline grain, so as to form the channel including the single crystalline grain with high mobility of a semi-thin-film transistor provides the formation conditions.

In some embodiments, the length of the first side slope 141 is less than or equal to 0.3 microns.

Specifically, the length of the first side slope 141 is less than or equal to 0.3 microns, so that the length of the channel 163 is smaller, for example, the length of the channel 163 is less than or equal to 0.3 microns, thereby reducing the number of grain boundaries in the channel 163 or the channel 163 is the single crystalline grain.

Specifically, in a specific implementation, the thickness of the first gate electrode 14 is 2100 angstroms, the slope angle α is 45 degree, the length of the first side slope 141 is 0.3 microns, and the channel 163 is the single crystalline grain.

In some embodiments, the channel 163 is at least part of the single crystalline grain.

Specifically, the channel 163 is at least part of the single crystalline grain, so that there is no grain boundary in the channel 163, and the mobility of carriers in the channel 163 is improved, thereby improving the mobility of the thin film transistor 101, it is beneficial to realize integration of the integrated circuit on the substrate, so as to reduce a manufacturing cost of the display panel.

In some embodiments, the length of the channel 163 ranges from 0.1 microns to 1 micron.

Specifically, the length of the channel 163 ranges from 0.1 microns to 1 micron, and the length of the channel 163 may be 0.1 microns, 0.2 microns, 0.3 microns, 0.4 microns, 0.5 microns, 0.6 microns, 0.7 microns, 0.8 microns, 0.9 microns, and 1.0 micron. At present, a size of the crystalline grain of amorphous silicon obtained by excimer laser annealing process is smaller, and difference between the current channel length greater than 2 microns is also large, so that the channel cannot be composed of the single crystalline grain. The length of the channel 163 ranges from 0.1 microns to 1 micron, which reduces the length of the channel 163, so that the length of the channel 163 tends to be same or similar to the size of the single crystalline grain of the current laser annealing process, so that reducing the number of the grain boundaries in the channel 163 or the channel 163 is the single crystalline grain.

Specifically, the thickness of the first gate electrode 14 and the slope angle α determine the length of the first side slope 141, which in turn determines the length of the channel 163, and the length of the channel 163 can be controlled by controlling the length of the first side slope 141. So that the length of the channel 163 can be controlled in a range of less than or equal to 1 micron, so that the composition of the channel 163 is the single crystalline grain, therefore, in the production process of forming the first gate electrode 14, the length of the first side slope 141 and the length of the channel 163 are controlled by controlling the thickness and the slope angle α of the first gate electrode 14.

Further, according to a design of the display panel 100 or the thin film transistor 101, a width of the channel 163 can be greater than or equal to 0.3 microns and less than or equal to 10 microns. Thus, the thin film transistor 101 has both high mobility and smaller size.

It should be noted that, it can be understood that in other embodiments, the channel 163 may also include polycrystalline grains, in other words, the channel 163 includes multiple grain boundaries. After the channel 163 is arranged on the first side slope 141, the length of the channel 163 is reduced to 0.1 microns to 1 micron. When the channel 163 includes the polycrystalline grains, the number of grain boundaries of the channel 163 is correspondingly reduced, further, it is beneficial to improve the mobility of the thin film transistor, and it is beneficial to realize the integration of the integrated circuit on the substrate, so as to reduce the manufacturing cost of the display panel.

In some embodiments, the first gate insulating layer 15 forms the corner part 31 corresponding to an end of the first side slope 141 close to the substrate 11, and the channel 163 covers the corner part 31.

Specifically, the channel 163 covers the corner part 31, during the process of crystallization to form the semiconductor layer 16, it is easier to form the seed crystal at the corner part 31 of the first side slope 141 close to the end of the substrate 11, when the seed crystal grows along the first side slope 141 to form the single crystalline grain, the length of the channel 163 on the first side slope 141 is smaller, which provides formation conditions for the channel 163 on the first side slope 141 to be composed of the single crystalline grain. There is no grain boundary in the single crystalline grain, which improves the mobility of the thin film transistor 101.

Specifically, as shown in FIG. 3 and FIG. 4, the corner part 31 refers to the end of the first side slope 141 close to the substrate 11, or the first gate insulating layer 15 corresponding to an end of the first side slope 141 close to the substrate 11.

Preferably, in some embodiments, a material of the semiconductor layer 16 is polysilicon.

Specifically, the semiconductor layer 16 is a low temperature polysilicon active pattern, but not limited thereto, the semiconductor layer 16 may also be a crystalline metal oxide active pattern.

In some embodiments, the thin film transistor 101 further includes a first insulating layer 17, a first through hole 171, a second through hole 172, the source electrode 181 and the drain electrode 182. The first insulating layer 17 is arranged on the semiconductor layer 16; the first through hole 171 penetrates the first insulating layer 17; the second through hole 172 penetrates the first insulating layer 17; the source electrode 181 and the drain electrode 182 are arranged on the first insulating layer 17, one of the source electrode 181 and the drain electrode 182 is electrically connected to the first end 161 through the first through hole 171, and another one of the source electrode 181 and the drain electrode 182 is electrically connected to the second end 162 through the second through hole 172.

In some embodiments, the thin film transistor 101 further includes a light shielding layer 12 and a passivation layer 13, the light shielding layer 12 is arranged between the substrate 11 and the first gate electrode 14, and an orthographic projection of the light shielding layer 12 on the substrate 11 covers t the orthographic projection of the channel 163 on the substrate 11; the passivation layer 13 is arranged between the light shielding layer 12 and the first gate electrode 14.

Specifically, the light shielding layer 12 is used to block external light such as a backlight from entering the channel 163, so as to avoid generation of photocurrent and improve the stability of the thin film transistor 101.

Embodiment 3

This embodiment is the same as or similar to the thin film transistor 101 or the display panel 100 of any one of the above-mentioned embodiments, the difference is that the features of the thin film transistor 101 or the display panel 100 are further described.

Figure 6:
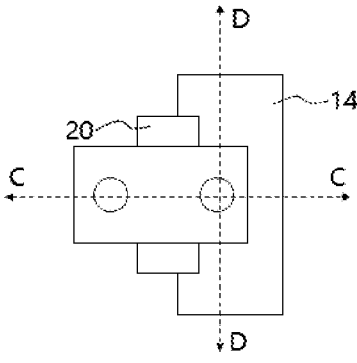
FIG. 6 is a schematic top view of a second thin film transistor of the display panel provided by an embodiment of the present application.
Figure 7:
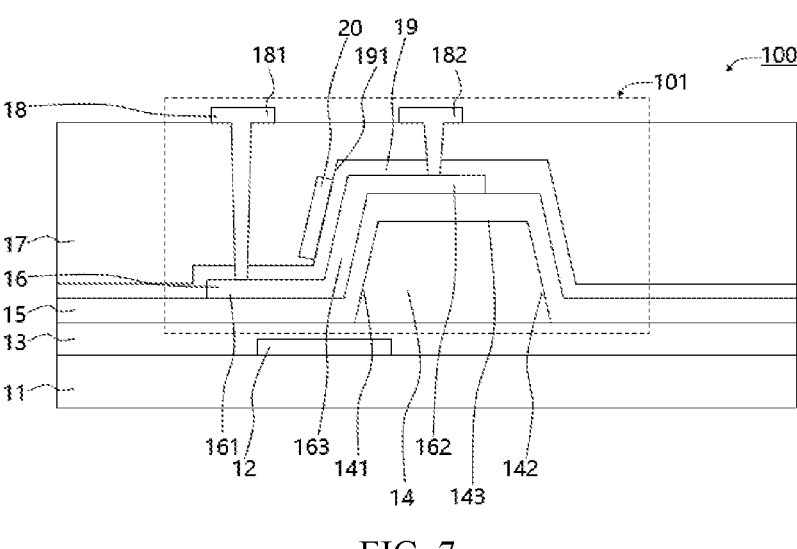
FIG. 7 is a first schematic cross-sectional view of a second thin film transistor of the display panel provided an embodiment of the present application.
Figures 8, 9:
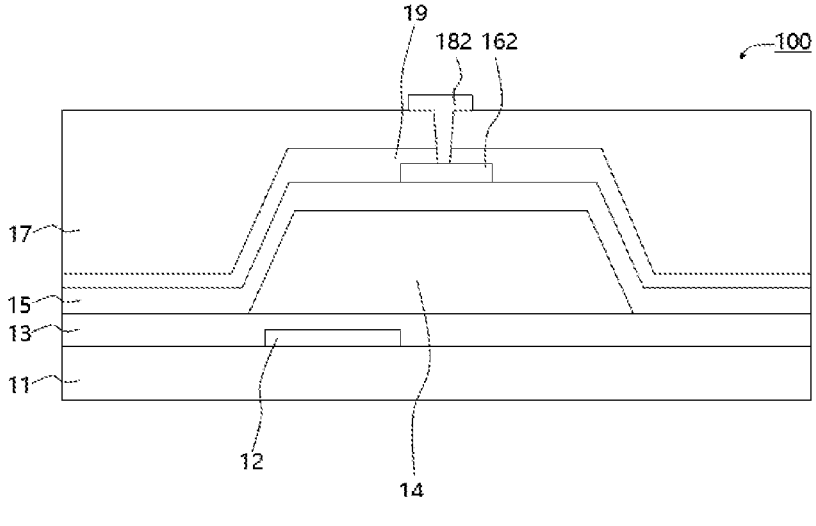
FIG. 8 is a second schematic cross-sectional view of the second thin film transistor of the display panel provided by an embodiment of the present application.
FIG. 9 is a schematic top view of a third thin film transistor of the display panel provided by an embodiment of the present application.

Please refer to FIG. 6, FIG. 7 and FIG. 8; FIG. 6 is a schematic top view of a second thin film transistor of the display panel provided by an embodiment of the present application. FIG. 7 is a first schematic cross-sectional view of a second thin film transistor of the display panel provided an embodiment of the present application. FIG. 8 is a second schematic cross-sectional view of the second thin film transistor of the display panel provided by an embodiment of the present application. In order to clearly present the important structure of the thin film transistor, only a part of the film layers or structures of the thin film transistor is illustrated in FIG. 6. FIG. 7 is a schematic cross-sectional view of the dotted line C-C in FIG. 6. FIG. 8 is a schematic cross-sectional view of the dotted line D-D in FIG. 6.

In some embodiments, the thin film transistor 101 further includes a second gate insulating layer 19 and a second gate electrode 20, the second gate insulating layer 19 is arranged between the semiconductor layer 16 and the first insulating layer 17; the second gate electrode 20 is arranged between the second gate insulating layer 19 and the first insulating layer 17, and the second gate electrode 20 is arranged corresponding to the channel 163.

Specifically, the thin film transistor 101 includes the first gate electrode 14 and the second gate electrode 20, the semiconductor layer 16 is arranged between the first gate electrode 14 and the second gate electrode 20, and the first gate electrode 14 and the second gate electrode 20 form a double gate structure, the double gate structure can enhance control ability of the channel 163, reduce a short channel effect, and increase an on-state current of the thin film transistor 101. In addition, adding the second gate electrode 20 can perform self-aligned doping process to enhance device stability.

In some embodiments, the second gate insulating layer 19 corresponding to the first side slope 141 defines a third side slope 191, and the second gate electrode 20 is located on the third side slope 191.

Specifically, the second gate insulating layer 19 is attached to the first side slope 141 to form the third side slope 191, and the second gate electrode 20 is located on the third side slope 191, so that the channel 163 is arranged between the first gate electrode 14 and the second gate electrodes 20, the layout space occupied by the second gate electrode 20 is smaller, which reduces the size of the thin film transistor 101.

In some embodiments, the thin film transistor 101 further includes a third through hole, the third through hole penetrates the first gate insulating layer 15 and the second gate insulating layer 19, and the second gate electrode 20 is connected to the first gate electrode 14 through the third through hole.

Specifically, although the third through hole is not shown in the schematic diagram, it is easy to understand that the third through hole penetrates the first gate insulating layer 15 and the second gate insulating layer 19, so that the second gate electrode 20 is connected to the first gate electrode 14 through the third through hole. The first gate electrode 14 and the second gate electrode 20 form the double gate structure, potentials of the first gate electrode 14 and the second gate electrode 20 are same, and the first gate electrode 14 and the second gate electrode 20 control the channel 163 together.

Embodiment 4

This embodiment is the same as or similar to the thin film transistor 101 or the display panel 100 of any one of the above-mentioned embodiments, the difference is that the features of the thin film transistor 101 or the display panel 100 are further described.

Figure 10:
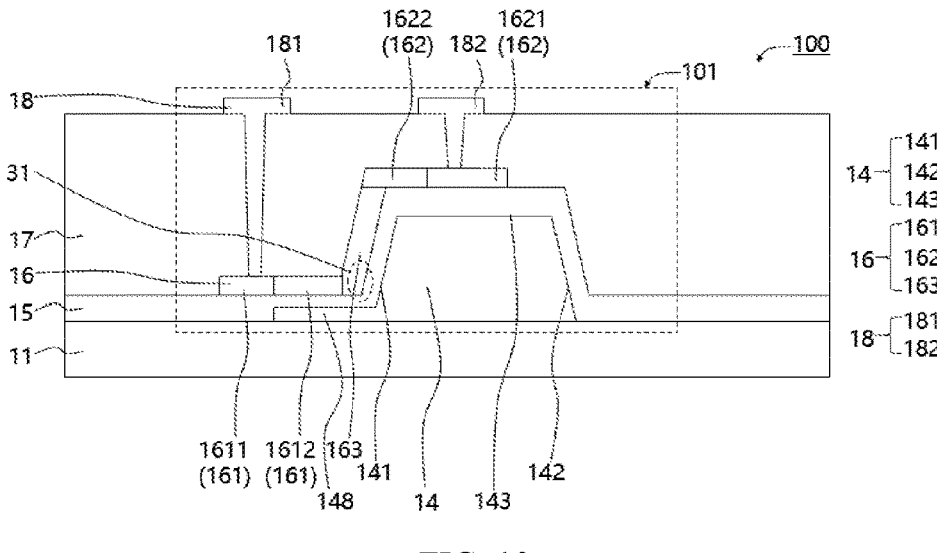
FIG. 10 is a first cross-section schematic diagram of the third thin film transistor of the display panel provided by an embodiment of the present application.
Figure 11:
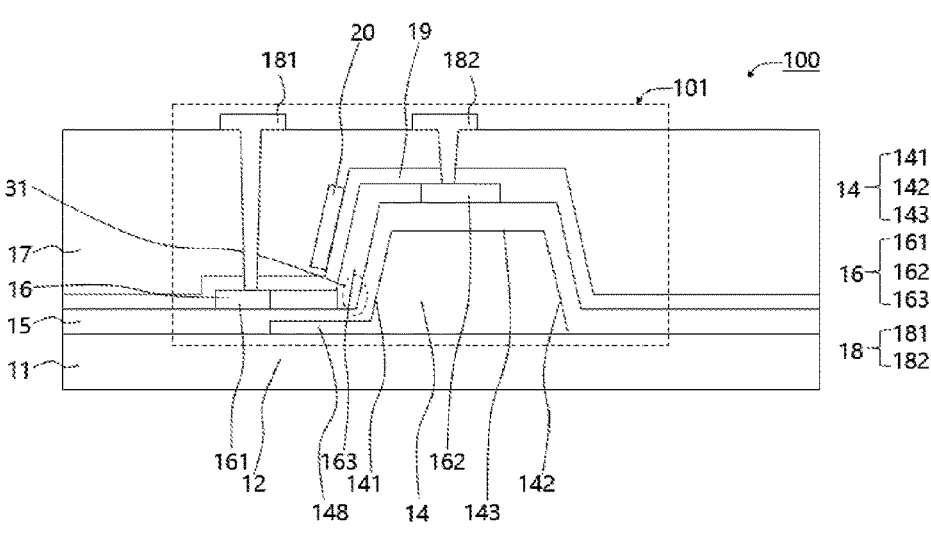
FIG. 11 is a schematic top view of a fourth thin film transistor of the display panel provided by an embodiment of the present application.

Please refer to FIG. 9, FIG. 10 and FIG. 11. FIG. 9 is a schematic top view of a third thin film transistor of the display panel provided by an embodiment of the present application. FIG. 10 is a first cross-section schematic diagram of the third thin film transistor of the display panel provided by an embodiment of the present application. FIG. 11 is a schematic top view of a fourth thin film transistor of the display panel provided by an embodiment of the present application. In order to clearly present the important structure of the thin film transistor, only a part of the film layers or structures of the thin film transistor is illustrated in FIG. 9. FIG. 10 is a schematic cross-sectional view of the dotted line E-E in FIG. 9.

In some embodiments, the thin film transistor 101 further includes an extension part 148 extending from the first side slope 141 to a side close to the semiconductor layer 16, a thickness of the extension part 148 is less than the thickness of the first gate electrode 14, and an orthographic projection of extension part 148 on substrate 11 at least partially overlaps the orthographic projection of channel 163 on substrate 11.

Specifically, the thin film transistor 101 further includes the extension part 148 extending from the first side slope 141 to the side close to the semiconductor layer 16, the extension part 148 is connected to an end of the first side slope 141 close to the substrate 11. The orthographic projection of the extension part 148 on the substrate 11 at least partially overlaps the orthographic projection of the channel 163 on the substrate 11, the first gate electrode 14 is used to control the channel 163, and the extension part 148 functions as a light shielding layer for shielding the external light from entering the channel 163.

Specifically, the extension part 148 is connected to the first gate electrode 14 at the end of the first side slope 141 close to the substrate 11, that is, a connection part of the extension part 148 and the first gate electrode 14 forms the corner part 31.

Specifically, a thickness of the extension part 148 is less than the thickness of the first gate electrode 14 to form the corner part 31 and the first side slope 141.

Preferably, in some embodiments, the orthographic projection of the extension part 148 and the first gate electrode 14 on the substrate 11 completely covers the orthographic projection of the channel 163 on the substrate 11, and the extension part 148 and the first gate electrode 14 can better block the external light such as the backlight from entering the channel 163 to avoid generating photocurrent, and improve the stability of the thin film transistor 101.

It should be noted that in some implementations, when the thin film transistor 101 does not include the extension part 148, for example, in the embodiment 1 to the embodiment 3, the display panel 100 further includes the light shielding layer 12, and the light shielding layer 12 is arranged on the substrate 11, the passivation layer 13 is arranged on the light shielding layer 12, and the first gate electrode 14 is arranged on the passivation layer 13. The light shielding layer 12 is used for shielding the external light from entering the channel 163, the orthographic projection of the light shielding layer 12 on the substrate 11 at least partially overlaps the orthographic projection of the channel 163 on the substrate 11, and both of orthographic projections of the light shielding layer 12 and the first gate electrode 14 on the substrate 11 covers the orthographic projection of the channel 163 on the substrate 11.

Embodiment 5

This embodiment also provides a manufacturing method of the display panel 100 according to any one of the embodiment 2, that is, the embodiment provides a first thin film transistor or a manufacturing method of the thin film transistor 101 shown in FIG. 3.

Figure 12:
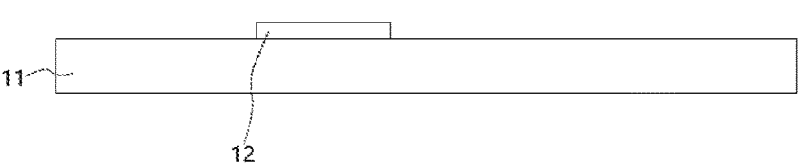
FIG. 12 is a first intermediate process schematic diagram of a manufacturing method of the first/second thin film transistor of the display panel provided by an embodiment of the present application.
Figure 13:
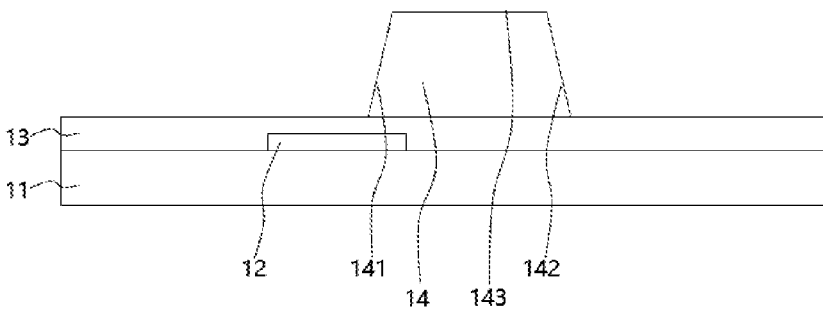
FIG. 13 is a second intermediate process schematic diagram of a manufacturing method of the first/second thin film transistor of the display panel provided by an embodiment of the present application.
Figure 14:
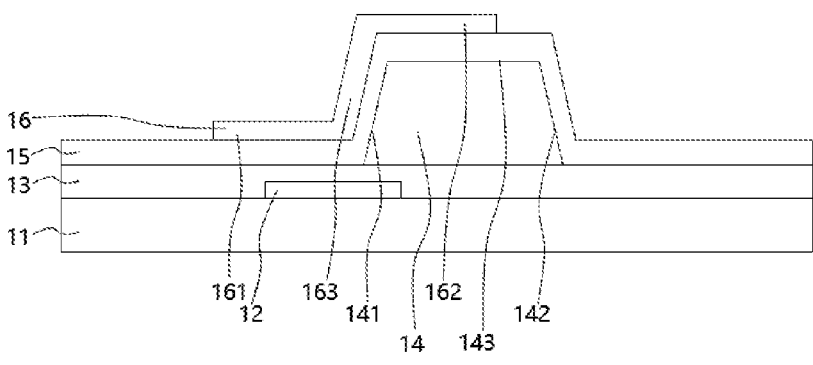
FIG. 14 is a third intermediate process schematic diagram of a manufacturing method of the first/second thin film transistor of the display panel provided by an embodiment of the present application.
Figure 15:
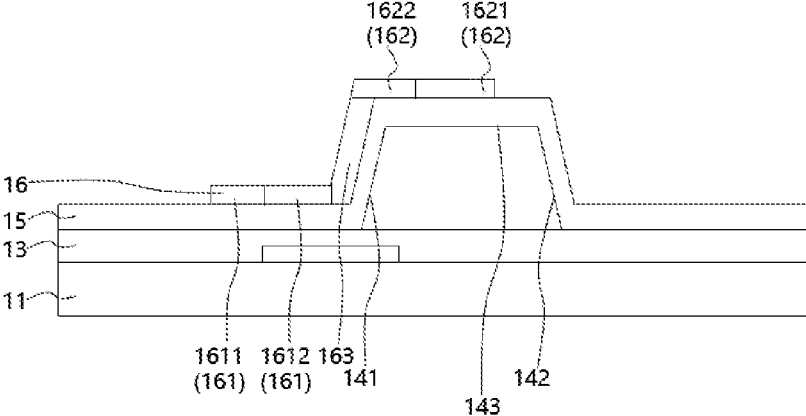
FIG. 15 is a fourth intermediate process schematic diagram of a manufacturing method of the first/second thin film transistor of the display panel provided by an embodiment of the present application.
Figure 16:
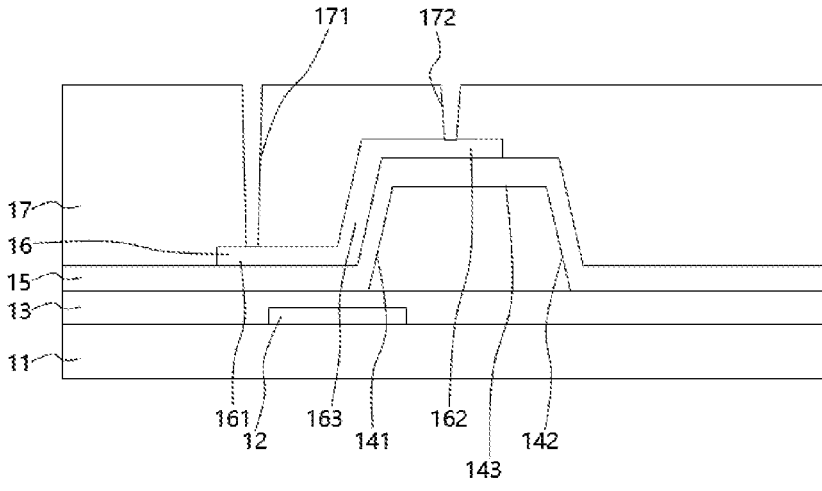
FIG. 16 is a fifth intermediate process schematic diagram of a manufacturing method of the first/second thin film transistor of the display panel provided by an embodiment of the present application.

Please refer to FIG. 12 to FIG. 16 and FIG. 3. FIG. 12 is a first intermediate process schematic diagram of a manufacturing method of the first/second thin film transistor of the display panel provided by an embodiment of the present application. FIG. 13 is a second intermediate process schematic diagram of a manufacturing method of the first/second thin film transistor of the display panel provided by an embodiment of the present application. FIG. 14 is a third intermediate process schematic diagram of a manufacturing method of the first/second thin film transistor of the display panel provided by an embodiment of the present application. FIG. 15 is a fourth intermediate process schematic diagram of a manufacturing method of the first/second thin film transistor of the display panel provided by an embodiment of the present application. FIG. 16 is a fifth intermediate process schematic diagram of a manufacturing method of the first/second thin film transistor of the display panel provided by an embodiment of the present application.

The manufacturing method of the display panel of this embodiment includes step S100, step S200, step S300, step S400, step S500, step S600, and step S700.

Step S100, as shown in FIG. 12, providing a substrate 11.

Step S200, as shown in FIG. 12, forming a light shielding layer 12 on the substrate 11.

Step S300, as shown in FIG. 13, forming a passivation layer 13 on the light shielding layer 12, and forming a first gate electrode 14 on the passivation layer 13.

Specifically, structure and features of the first gate electrode 14 are the same as or similar to the first gate electrode 14 in embodiment 1 to embodiment 2 or shown in FIG. 3, and details are not described herein again.

Step S400, as shown in FIG. 14, forming a first gate insulating layer 15 on the first gate electrode 14, and forming a semiconductor layer 16 on the first gate insulating layer 15.

Step S500, as shown in FIG. 15, doping treatment is performed on the semiconductor layer 16.

Specifically, in step S400 and step S500, structure and features of the semiconductor layer 16 are the same as or similar to the semiconductor layer 16 in embodiment 1 to embodiment 2 or shown in FIG. 3, and details are not repeated here.

Step S600, as shown in FIG. 16, forming a first insulating layer 17 on the semiconductor layer 16, and the first insulating layer 17 defines a first through hole 171 and a second through hole 172.

Specifically, structure and features of the first insulating layer 17 in step S600 are the same as or similar to the first insulating layer 17 in embodiment 1 to embodiment 2 or shown in FIG. 3, and details are not repeated here.

Step S700, as shown in FIG. 3, forming a source electrode 181 and a drain electrode 182.

Specifically, forming a source-drain metal layer 18 on the first insulating layer 17, and patterning the source-drain metal layer 18 to form the source electrode 181 and the drain electrode 182. structure and features of the source electrode 181 and the drain electrode 182 are the same as or similar to the embodiment 1 to the embodiment 2 or shown in or in FIG. 3, and details are not repeated here.

Embodiment 6

This embodiment also provides the manufacturing method of the display panel 100 according to any one of the embodiment 3, that is, the embodiment provides the first thin film transistor or the manufacturing method of the thin film transistor 101 shown in FIG. 7.

Figure 17:
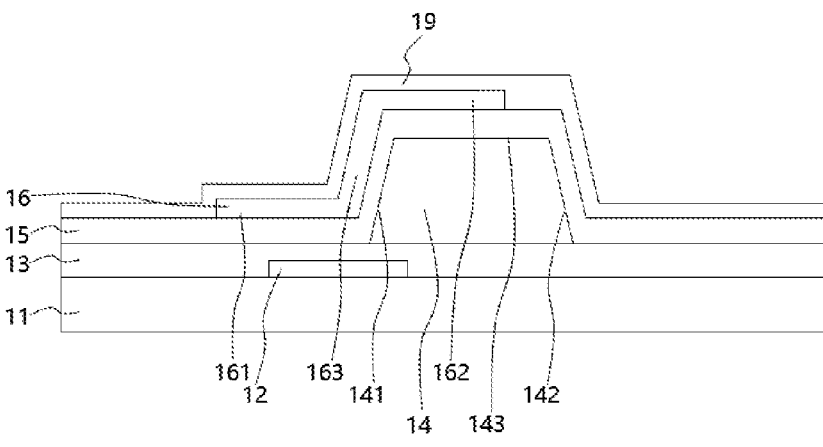
FIG. 17 is a fifth intermediate process schematic diagram of the manufacturing method of the second thin film transistor of the display panel provided by an embodiment of the present application.
Figure 18:
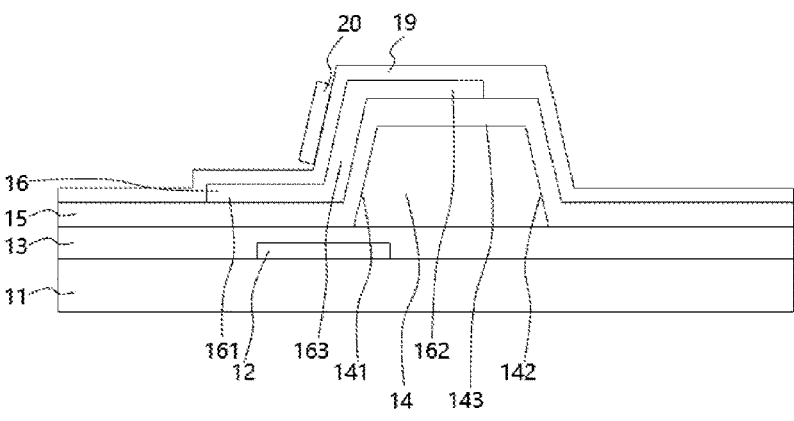
FIG. 18 is a sixth intermediate process schematic diagram of the manufacturing method of the second thin film transistor of the display panel provided by an embodiment of the present application.
Figure 19:
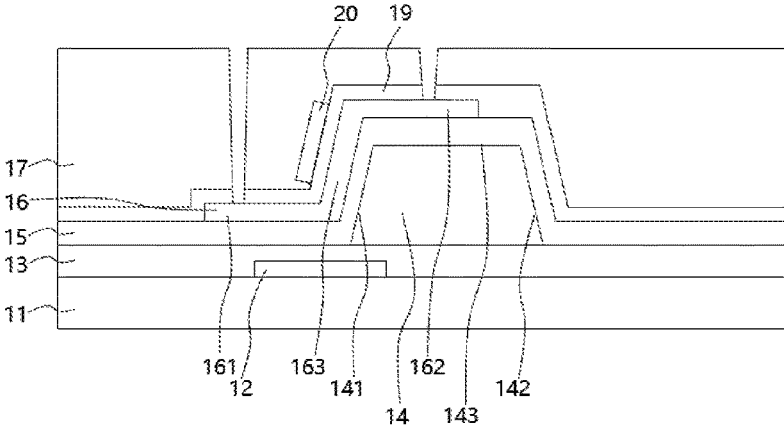
FIG. 19 is a seventh intermediate process schematic diagram of the manufacturing method of the second thin film transistor of the display panel provided by an embodiment of the present application.

Please refer to FIG. 12 to FIG. 15, FIG. 17 to FIG. 19 and FIG. 7. FIG. 12 is the first intermediate process schematic diagram of a manufacturing method of the first/second thin film transistor of the display panel provided by an embodiment of the present application. FIG. 13 is the second intermediate process schematic diagram of a manufacturing method of the first/second thin film transistor of the display panel provided by an embodiment of the present application. FIG. 14 is the third intermediate process schematic diagram of a manufacturing method of the first/second thin film transistor of the display panel provided by an embodiment of the present application. FIG. 15 is the fourth intermediate process schematic diagram of a manufacturing method of the first/second thin film transistor of the display panel provided by an embodiment of the present application. FIG. 17 is a fifth intermediate process schematic diagram of the manufacturing method of the second thin film transistor of the display panel provided by an embodiment of the present application. FIG. 18 is a sixth intermediate process schematic diagram of the manufacturing method of the second thin film transistor of the display panel provided by an embodiment of the present application. FIG. 19 is a seventh intermediate process schematic diagram of the manufacturing method of the second thin film transistor of the display panel provided by an embodiment of the present application.

The manufacturing method of the display panel of this embodiment includes step S100, step S200, step S300, step S400, step S500, step S600, and step S700.

Step S100, as shown in FIG. 12, providing the substrate 11.

Step S200, as shown in FIG. 12, forming the light shielding layer 12 on the substrate 11.

Step S300, as shown in FIG. 13, forming the passivation layer 13 on the light shielding layer 12, and forming the first gate electrode 14 on the passivation layer 13.

Specifically, the structure and the features of the first gate electrode 14 are the same as or similar to the first gate electrode 14 in embodiment 1 to embodiment 3 or shown in FIG. 3, and details are not described herein again.

Step S400, as shown in FIG. 14, forming the first gate insulating layer 15 on the first gate electrode 14, and forming the semiconductor layer 16 on the first gate insulating layer 15.

Step S500, as shown in FIG. 15, doping treatment is performed on the semiconductor layer 16.

Specifically, in step S400 and step S500, the structure and the features of the semiconductor layer 16 are the same as or similar to the semiconductor layer 16 in embodiment 1 to embodiment 3 or shown in FIG. 3/FIG. 7, and details are not repeated here.

Step S600, as shown in FIG. 17, forming a second gate insulating layer 19 on the semiconductor layer 16.

Specifically, a structure and features of the second gate insulating layer 19 are the same as or similar to the second gate insulating layer 19 in embodiment 3 or shown in FIG. 7, and details are not repeated here.

Step S700, as shown in FIG. 18, forming a second gate electrode 20 on the second gate insulating layer.

Specifically, a structure and features of the second gate electrode 20 are the same as or similar to the second gate electrode 20 in embodiment 3 or shown in FIG. 7, and details are not repeated here.

Step S800, as shown in FIG. 19, forming the first insulating layer 17 on the second gate electrode 20, and the first insulating layer 17 defines the first through hole 171 and the second through hole 172.

Specifically, in step S800, the structure and the features of the first insulating layer 17 are the same as or similar to shown in the embodiment 3 or FIG. 7, and details are not repeated here.

Step S900, as shown in FIG. 7, forming the source electrode 181 and the drain electrode 182.

Specifically, forming the source drain metal layer 18 on the first insulating layer 17, and patterning the source drain metal layer 18 to form the source electrode 181 and the drain electrode 182, the structure and the features of the source electrode 181 and the drain electrode 182 are the same as or similar to shown the embodiment 3 or shown in FIG. 7, and details are not repeated here.

Embodiment 7

This embodiment also provides the manufacturing method of the display panel 100 according to any one of the embodiment 4, that is, the embodiment provides a third/fourth thin film transistor or the manufacturing method of the thin film transistor 101 shown in FIG. 10/FIG. 11.

Figure 20:
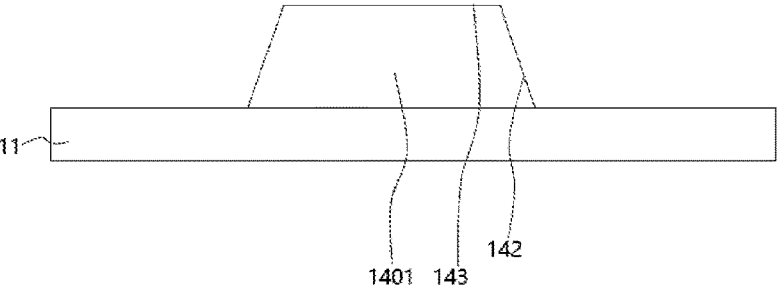
FIG. 20 is a first intermediate process schematic diagram of the manufacturing method of the first gate electrode 14 of the thin film transistor of the display panel provided by an embodiment of the present application.
Figure 21:
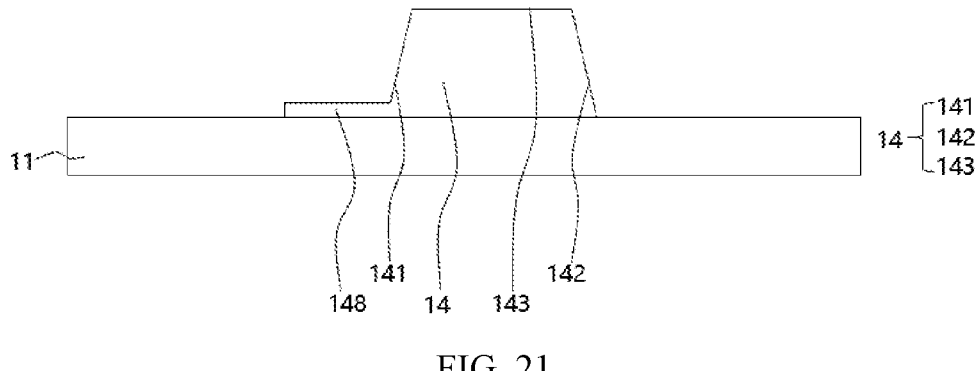
FIG. 21 is a second intermediate process schematic diagram of the manufacturing method of the first gate electrode 14 of the thin film transistor of the display panel provided by an embodiment of the present application.

Please refer to FIG. 20 and FIG. 21. FIG. 20 is a first intermediate process schematic diagram of the manufacturing method of the first gate electrode 14 of the thin film transistor of the display panel provided by an embodiment of the present application. FIG. 21 is a second intermediate process schematic diagram of the manufacturing method of the first gate electrode 14 of the thin film transistor of the display panel provided by an embodiment of the present application.

This embodiment provides the third thin film transistor or the manufacturing method of the thin film transistor 101 shown in FIG. 10. The third thin film transistor or the manufacturing method of the thin film transistor 101 shown in FIG. 10 is similar to the embodiment 5, difference is that there is no the light shielding layer 12 and a manufacturing process of the first gate electrode 14 is different.

This embodiment provides the fourth thin film transistor or the manufacturing method of the thin film transistor 101 shown in FIG. 11. The fourth thin film transistor or the manufacturing method of the thin film transistor 101 shown in FIG. 11 is similar to the embodiment 6, difference is that there is no the light shielding layer 12 and the manufacturing process of the first gate electrode 14 is different.

As shown in FIG. 20 and FIG. 21, forming a preset pattern 1401 of a pattern of the first gate electrode 14 by a first etching, and then forming the first gate electrode 14 and the extension part 148 by a second etching.

Specifically, as shown in FIG. 20, forming the preset pattern 1401 of the pattern of the first gate electrode 14 by the first etching, and a thickness of the extension part 148 is same as a thickness of the first gate electrode 14 at that time.

Specifically, as shown in FIG. 21, forming the first gate electrode 14 and the extension part 148 by the second etching, that is, the thickness of the extension part 148 is reduced by the second etching.

Specifically, the structure and the features of the first gate electrode 14 and structure and features the extension part 148 are same as or similar to the embodiment 4 or shown FIG. 10 or FIG. 11, and details are not repeated here.

It should be noted that in the display panel 100 or the thin film transistor 101 of any one of the above embodiments, the length of the channel 163 can be controlled by controlling the length of the first side slope 141, so that the composition of channel 163 is the single crystalline grain, which is beneficial to improve the mobility of the thin film transistor and to realize the integration of the integrated circuit on the substrate, so as to reduce the manufacturing cost of the display panel.

It should be noted that in the display panel 100 or the thin film transistor 101 of any one of the above embodiments, the channel 163 may also include multiple crystalline grains. In other words, the channel 163 includes a plurality of grain boundaries. After the channel 163 is arranged on the first side slope 141, when the channel 163 includes polycrystalline grains, the number of grain boundaries of the channel 163 is correspondingly reduced, which is beneficial to improve the mobility of the thin film transistor and to realize the integration of the integrated circuit on the substrate, so as to reduce the manufacturing cost of the display panel.

Embodiment 8

Figure 22:
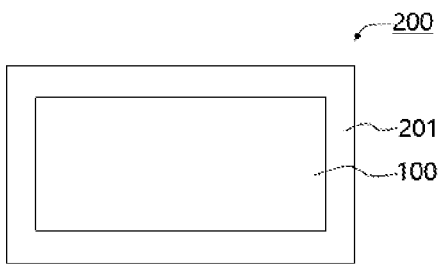
FIG. 22 is a schematic diagram of a display terminal 200 provided by an embodiment of the present application.

Please refer to FIG. 22. FIG. 22 is a schematic diagram of a display terminal 200 provided by an embodiment of the present application.

The present application also provides the display terminal 200, the display terminal 200 includes the display panel 100 of any one of the foregoing embodiments.

Specifically, the display terminal 200 can be a mobile phone, a notebook computer, a TV, etc. The display terminal 200 can also include a terminal body 201, the terminal body 201 combined with the display panel 100 as a whole, the terminal body 201 can be a shell, a drive structure and other structures and components of the display terminal 200.

The display panel provided by the embodiments of the present application has been introduced in detail above, and the principles and implementations of the present application are described with specific examples. Its core idea; at the same time, for those skilled in the art, according to the idea of the application, there will be changes in the specific implementation and application scope. In summary, the content of this specification should not be construed as a limitation to the present application.

What is claimed is:

1. A display panel, comprising a substrate and a thin film transistor arranged on the substrate, wherein the thin film transistor comprises:

a first gate arranged on the substrate, wherein the first gate comprises; a first side slope and a second side slope oppositely arranged and a top surface arranged between the first side slope and the second side slope;

a first gate insulating layer covering the substrate, the first side slope, the second side slope, and the top surface;

a semiconductor layer arranged on the first gate insulating layer, wherein the semiconductor layer comprises a first end, a second end, and a channel located between the first end and the second end, the second end is at least partially located on the top surface, and the channel is at least partially located on the first side slope;

a first insulating layer arranged on the semiconductor layer;

a first through hole penetrating the first insulating layer;

a second through hole penetrating the first insulating layer; and a source electrode and a drain electrode arranged on the first insulating layer, wherein one of the source electrode and the drain electrode is electrically connected to the first end through the first through hole, and another one of the source electrode and the drain electrode is electrically connected to the second end through the second through hole, wherein the thin film transistor further comprises an extension part extending from the first side slope to a side close to the semiconductor layer, a thickness of the extension part is less than a thickness of the first gate electrode, and an orthographic projection of the extension part on the substrate at least partially overlaps an orthographic projection of the channel on the substrate.

2. The display panel as claimed in claim 1, wherein the orthographic projection of the channel on the substrate overlaps an orthographic projection of the first side slope on the substrate.

3. The display panel as claimed in claim 1, wherein a slope angle between the first side slope and the substrate is greater than or equal to 45 degrees and less than or equal to 90 degrees.

4. The display panel as claimed in claim 1, wherein a thickness of the first gate insulating layer corresponding to the substrate is greater than a thickness of the first gate insulating layer corresponding to the first side slope.

5. The display panel as claimed in claim 4, wherein the thickness of the first gate insulating layer corresponding to the substrate is 1.2 to 2 times the thickness of the first gate insulating layer corresponding to the first side slope.

6. The display panel as claimed in claim 1, wherein a thickness of the first gate electrode is in a range of 0.1 microns to 1 micron.

7. The display panel as claimed in claim 6, wherein a length of the first side slope is less than or equal to 0.3 microns.

8. The display panel as claimed in claim 1, wherein the channel is at least part of a single crystalline grain.

9. The display panel as claimed in claim 1, wherein a length of the channel ranges from 0.1 microns to 1 micron.

10. The display panel as claimed in claim 1, wherein the first gate insulating layer corresponding to an end of the first side slope close to the substrate forms a corner part, and the channel covers the corner part.

11. The display panel as claimed in claim 1, wherein the thin film transistor further comprises:

a light shielding layer arranged between the substrate and the first gate electrode, wherein an orthographic projection of the light shielding layer on the substrate covers the orthographic projection of the channel on the substrate; and a passivation layer arranged between the light shielding layer and the first gate electrode.

12. A display panel, comprising a substrate and a thin film transistor arranged on the substrate, wherein the thin film transistor comprises:

a first gate arranged on the substrate, wherein the first gate comprises: a first side slope and a second side slope oppositely arranged and a top surface arranged between the first side slope and the second side slope;

a first gate insulating layer covering the substrate, the first side slope, the second side slope, and the top surface;

a semiconductor layer arranged on the first gate insulating layer, wherein the semiconductor layer comprises a first end, a second end, and a channel located between the first end and the second end, the second end is at least partially located on the top surface, and the channel is at least partially located on the first side slope;

a first insulating layer arranged on the semiconductor layer;

a first through hole penetrating the first insulating layer;

a second through hole penetrating the first insulating layer;

a source electrode and a drain electrode arranged on the first insulating layer, wherein one of the source electrode and the drain electrode is electrically connected to the first end through the first through hole, and another one of the source electrode and the drain electrode is electrically connected to the second end through the second through hole;

a second gate insulating layer arranged between the semiconductor layer and the first insulating layer; and a second gate electrode arranged between the second gate insulating layer and the first insulating layer, wherein the second gate electrode is arranged corresponding to the channel.

13. The display panel as claimed in claim 12, wherein the second gate insulating layer has a third side slope corresponding to the first side slope and away from the first insulating layer, and the second gate electrode is located on the third side slope.

14. The display panel as claimed in claim 12, wherein the thin film transistor further comprises a third through hole penetrating through the first gate insulating layer and the second gate insulating layer, and the second gate electrode is connected to the first gate electrode through the third through hole.

15. The display panel as claimed in claim 1, wherein the extension part is connected to the first gate electrode at an end of the first side slope close to the substrate.

16. The display panel as claimed in claim 15, wherein both the orthographic projection of the extension part on the substrate and an orthographic projection of the first gate electrode on the substrate cover the orthographic projection of the channel on the substrate.

* * * * *